Jan. 9, 1962
J. E. RIDDLE
3,016,148
MOUNTING FOR CIRCUIT BOARDS
Filed March 3, 1960
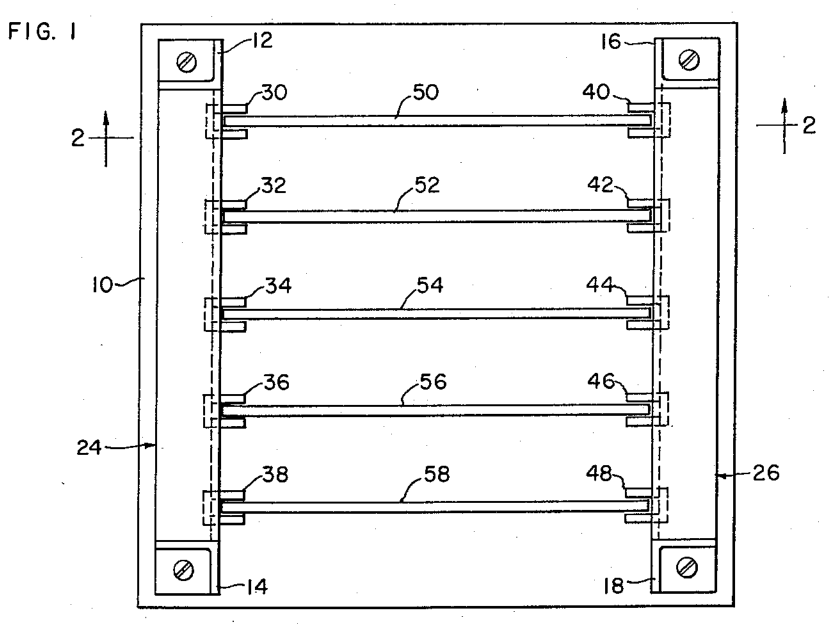
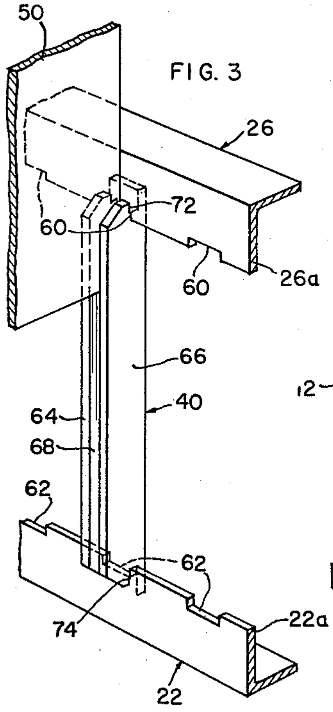
FIG. 3
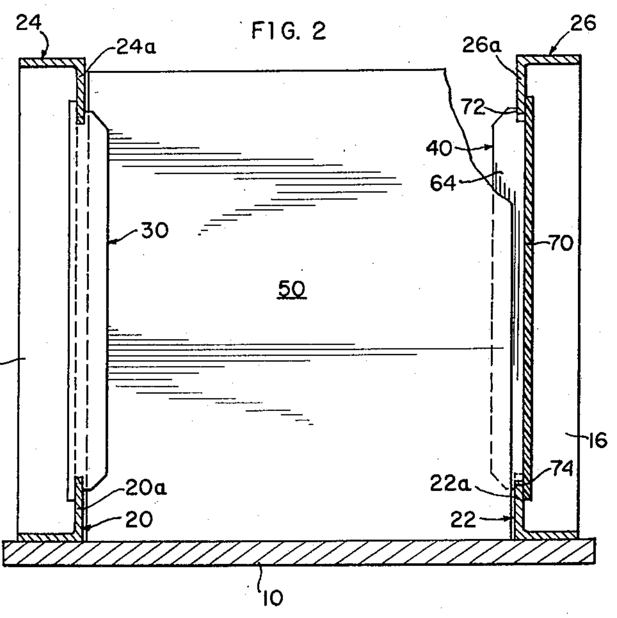
FIG. 2
INVENTOR.
JOSEPH E. RIDDLE
BY [signature]
ATTORNEY United States Patent Office 3,016,148
Patented Jan. 9, 1962

3,016,148
MOUNTING FOR CIRCUIT BOARDS

Joseph E. Riddle, Woodland Hills, Calif., assignor to General Precision, Inc., a corporation of Delaware Filed Mar. 3, 1960, Ser. No. 12,581
6 Claims. (Cl. 211—41)

The present invention relates to an improved means for supporting one or more circuit boards of the type which, in turn, is intended to support a plurality of electrical components and which also is intended to support electrical circuitry for inter-connecting such components.

In the more complex present-day electronic systems, in particular, appropriate mounting means for the electrical and electronic components and circuitry used in such systems is most essential. It is also desirable that the electrical components and circuitry in such systems be supported on a plurality of removable circuit boards or panels, so as to facilitate servicing and replacement of the equipment.

Because of the requirements mentioned in the preceding paragraph, it is usual for the electronic components and circuitry in most present-day electronic systems and equipment to be supported on a plurality of circuit boards. Each circuit board is usually composed of an insulating material, and appropriate electrical conductors are formed on one or both surfaces of the board by any desired one of many known present-day methods. Terminal apertures are formed in the board, and electronic components are supported in the terminal apertures in electrical contact with the circuitry.

The present invention is concerned with an improved assembly for mounting such boards in electronic systems. The improved mounting assembly of the invention supports the boards in an improved and simplified manner, and without the need for screws, rivets or other fastening devices.

In the embodiment of the invention to be described, a mounting frame is provided which includes first and second pairs of frame members. The circuit boards are supported in upright, mutually spaced and parallel positions between the pairs of frame members. The frame members of each pair are, themselves, disposed parallel to one another, and they are slotted so that channel-shaped supports for the circuit boards may be rigidly held between them in an interlocked manner, as will be described. The channel-shaped support members so supported by the frame members, extend perpendicularly between the frame members of each pair. The ends of the channel-shaped members are slotted, and they extend into corresponding ones of the slots in the frame members in an interlocked relationship. Each of the circuit boards is supported by one of the channel-shaped members extending between one pair of the frame members and by one of the channel-shaped members extending between the other pair of the frame members. The respective ends of the particular circuit board are held in slidable relationship in the channel-shaped members to support the board in an upright position between the pairs of frame members.

The channel-shaped members are preferably composed of a deformable material so that they may be inserted into an interlocked position between the respective pairs of frame members by a simple bending operation and without the need for any extraneous fastening device. Nylon is an appropriate material for this purpose. When nylon is used, the channel-shaped members may first be immersed in boiling water for a period, for example, of the order of two minutes. This causes the channel-shaped members to assume a softened condition. They may then be deformed and inserted between the corresponding pair of frame members. Then, when the channel members cool, they harden into their original configuration and are firmly and rigidly supported between the corresponding pair of frame members, with their ends extending into the interlocking slots in the frame members.

The individual circuit boards may be supported in the respective pairs of channel-shaped members in a sliding relationship therewith, as mentioned above. This permits the boards to be easily removed for repair of replacement purposes.

The features and advantages of the invention will become more apparent from a consideration of the following specification when taken in conjunction with the accompanying drawings, in which:

FIGURE 1 is a top plan view of an assembly which includes a plurality of circuit boards supported in spaced parallel relationship between two pairs of parallel frame members in accordance with the concepts of the present invention;

FIGURE 2 is a sectional elevational view of the assembly of FIGURE 1, taken substantially on the line 2—2 of FIGURE 1, and illustrating the manner in which a pair of channel-shaped members are supported in the frame members and, in turn, slidably supporting a corresponding one of the circuit boards; and FIGURE 3 is a fragmentary perspective view of the assembly, this latter view illustrating particularly the manner in which the channel-shaped members are supported in interlocking slots in the frame members.

The assembly illustrated in the accompanying drawings includes a suitable base member 10. A plurality of upstanding brackets 12, 14, 16 and 18 are fastened to the base member by appropriate screws. A pair of lower elongated angle frame members 20 and 22 are secured to the base member 10, and these elongated frame members extend across the base member in spaced and parallel relationship. The upstanding brackets 12, 14, 16 and 18 support an upper pair of elongated angle frame members 24 and 26 in such a manner that the angle frame member 26 is disposed directly over the angle frame member 22, and the angle frame member 24 is disposed directly over the angle frame member 20.

The angle frame members 20, 22, 24 and 26 are slotted in the manner shown for the members 22 and 26, for example, in FIGURE 3. These slots are formed in the lower edge of the portion **26*a* of the member 26, and in the upper edge of the portion 22*a* of the member 22. A plurality of channel-shaped members 30, 32, 34, 36 and 38 are held in the slots between the angle members 20 and 24 in a manner to be described. The channel-shaped members 30, 32, 34, 36 and 38 extend between the members 20 and 24, and the channel-shaped members are held in the slots formed in the elongated angle frame members 20 and 24. Likewise, a plurality of channel-shaped members 40, 42, 44 46 and 48 extend between the angle members 22 and 26, and these latter channel-shaped members are held in similar slots in the angle members 22 and 26. A plurality of circuit boards 50, 52, 54, 56 and 58 are supported by respective pairs of the channel-shaped members, and the circuit boards extend between the angle frame members 24, 26, and 20, 22**, in spaced parallel relationship, as best shown in FIGURE 1.

The elongated angle members 22 and 26 form, therefore, a first pair of elongated frame members respectively including first and second co-planar strip portions **22*a* and 26*a*, which are disposed in a parallel relationship and are spaced from one another by a particular vertical distance. The members 40, 42, 44, 46 and 48 constitute a first plurality of channel-shaped members extending between the frame members 22 and 26 in perpendicular relationship with the frame members. These channel-shaped members are mounted in the frame members 22** or 26 to slidably engage one end of respective ones of the circuit boards 50, 52, 54, 56 and 58.

The elongated angle members 20 and 24 form a second pair of elongated frame members, and they include first and second co-planar strip portions 20a and 24a, which also are disposed in parallel relationship. The strip portions 20a and 24a are spaced from one another by the same vertical distance as the strip portions 22a and 26a. The second plurality of channel-shaped supporting members 30, 32, 34, 36 and 38 extend between the frame members 20 and 24 in perpendicular relationship with the frame members, and these latter channel-shaped supporting members are mounted on the frame members for slidable engagement with the other end of respective ones of the circuit boards.

In a manner to be described, each of the channel-shaped members is rigidly supported between the corresponding pair of frame members. Moreover, this is achieved without the need for rivets, screws, or other fastening devices. Moreover, the channel-shaped members may be quickly and conveniently inserted into an interlocked position between the frame members. The circuit boards are slidably supported by the channel-shaped members, so that individual boards may be conveniently removed for repair or replacement purposes. The assembly may be formed into a rigid unitary configuration, by the provision of an upper base, similar to the base 10, and fastened to the channel members 24 and 26.

The manner in which any one of the channel-shaped members, such as the channel-shaped member 40, may be inserted and supported by the frame members 22 and 26, is more clearly shown in FIGURE 3. As shown in FIGURE 3, the upper elongated angle frame member 26 has a longitudinally extending vertically disposed strip portion 26a, and the strip portion 26a has a plurality of slots 60 formed in its lower edge. These slots are spaced along the lower edge, and each are intended to receive the upper end of a corresponding one of the channel-shaped members, such as the member 40, so as to hold that member in a rigid interlocked position.

The lower elongated angle frame member 22 is disposed in spaced and parallel relationship with the upper frame member 26, and the frame member 22 as a longitudinally extending vertical disposed strip portion 22a. The latter strip portion is co-planar with the strip portion 26a, and it is displaced from the strip portion by a particular distance. The lower strip portion 22a also has a plurality of slots 62, formed in its upper edge, and these latter slots are in respective vertical alignment with the slots in the strip portion 26a. The slots in the strip portion 22a are intended to receive the lower ends of the channel-shaped members, such as the member 40, and to rigidly support the channel-shaped members in an interlocked condition.

As shown in FIGURE 3, the channel-shaped member 40 has an over-all length greater than the vertical distance between the strip portions 22a and 26a. The channel-shaped member 40 has a pair of sides 64 and 66 which are parallel to one another and which define a longitudinal channel 68. The member 40 also includes a base portion 70 (FIGURE 2) which is integral with the sides and which interconnects the sides. The upper end of the member 40 is shaped to define a transverse slot 72, which is intended to engage the lower edge of the strip portion 26a in one of the slots 60 thereof. The lower end of the member 40 is shaped to define a transverse slot 74, which is intended to engage the upper edge of the strip portion 22a in the corresponding vertically-aligned slot therein.

In accordance with the invention, the channel-shaped member 40 is composed of a deformable material. The material has such composition that the channel-shaped member may be deformed and inserted in place between the frame members 22 and 26. Then, when the member 40 returns to its original shape, it is rigidly supported between the frame members.

A suitable material for the channel-shaped member 40 is, as mentioned above, nylon. When the channel-shaped member 40 is composed of nylon, it may be immersed in boiling water for a period of the order of two minutes. This causes the channel-shaped member to assume a softened condition. The member may then be bent and otherwise deformed, and easily inserted in place between the frame members 22 and 26. When the channel-shaped member 40 cools, it hardens into its original shape, to be rigidly supported between the frame members.

In the manner described above, as many of the channel-shaped members as are required may be quickly and easily inserted in place between the frame members. Moreover, this may be achieved without the need for screws, rivets, or any other fastening devices. When the channel-shaped members are in place, the circuit boards may conveniently be slipped down into position between them, in the manner illustrated in FIGURES 1, 2 and 3.

The invention provides, therefore, an improved assembly for supporting one or more circuit boards, and which includes a plurality of unique channel-shaped components which may be supported in an improved and simplified manner in a frame structure in the assembly and which serve to support the circuit boards in an upright mutually spaced relationship in the frame structure.

I claim:

1. A mounting assembly for a circuit board, and the like, including: an upper elongated frame member having a first longitudinally extending vertically disposed strip portion, a lower elongated frame member disposed in spaced and parallel relationship with said upper frame member and having a second longitudinally extending vertically disposed strip portion coplanar with said first strip portion and displaced therefrom by a particular distance, a channel-shaped supporting member extending between said upper and lower frame members in perpendicular relationship therewith and mounted thereon to support the circuit board, said channel-shaped supporting member having a length greater than said particular distance between said first and second strip portions and having slotted end portions respectively engaging the lower edge of said first strip portion and the upper edge of said second strip portion, and said channel-shaped supporting member being composed of a deformable material to permit the same to be inserted into its mounted portion between the upper and lower frame members.

2. A mounting assembly for a circuit board, and the like, including: an upper elongated frame member having a first longitudinally extending vertically disposed strip portion having at least one slot formed in the lower edge thereof, a lower elongated frame member disposed in spaced and parallel relationship with said upper frame member and having a second longitudinally extending vertically disposed strip portion co-planar with said first strip portion and displaced therefrom by a particular distance and having at least one slot formed in the upper edge thereof in vertical alignment with said slotted and said first strip portion, a channel-shaped supporting member extending between said upper and lower frame members in perpendicular relationship therewith and supported thereby to support the circuit board, said channel-shaped supporting member having a length greater than said particular distance between said first and second strip portions and having slotted end portions respectively engaging the lower edge of said first strip portion in the slot therein and the upper edge of said second strip portion in the slot therein, and said channel-shaped supporting member being composed of a deformable material to permit the same to be inserted into its supported position between the frame members.

3. The combination defined in claim 2 in which said channel-shaped supporting member is composed of nylon.

4. A mounting assembly for at least one circuit board, and the like, including: a first pair of frame members each having an edge and disposed in spaced relationship and with the respective edges thereof displaced from one another by a particular distance, a first channel-shaped supporting member extending between the frame members of said first pair and mounted thereon for supporting one end of the circuit board, a second pair of frame members each having an edge and disposed in spaced relationship and with the respective edges thereof displaced from one another by a particular distance, a second channel-shaped supporting member extending between the frame members of said second pair and mounted thereon for supporting the other end of the circuit board, said first and second channel supporting members each having a length greater than the distance between the respective edges of the frame members of corresponding ones of said pairs, and each of said channel-shaped supporting members having slotted end portions for respectively receiving the respective edges of corresponding ones of the frame members, said channel-shaped supporting members being composed of a deformable material to permit the same to be deformed and inserted between the corresponding ones of the frame members.

5. A mounting assembly for at least one circuit board, and the like, including: a first pair of elongated frame members respectively including first and second co-planar strip portions each having an edge and disposed in parallel relationship and with the respective edges thereof spaced from one another by a particular distance, a first channel-shaped supporting member extending between the frame members of said first pair in perpendicular relationship therewith and mounted thereon for supporting one end of the circuit board, a second pair of elongated frame members respectively including first and second coplanar strip portions each having an edge and disposed in parallel relationship and with the respective edges thereof spaced from one another by said particular distance, a second channel-shaped supporting member extending between the frame members of said second pair in perpendicular relationship therewith and mounted thereon for supporting the other end of the circuit board, said first and second channel-shaped supporting members each having a length greater than said particular distance and each having slotted end portions for receiving the respective edges of corresponding ones of said strip portions, and said channel-shaped supporting members being composed of a deformable material to permit the same to be deformed and inserted into end mounted positions between said frame members.

6. The combination defined in claim 5 and in which the edges of said strip members have slots formed therein for respectively receiving the slotted end portions of said channel-shaped supporting members.

References Cited in the file of this patent

UNITED STATES PATENTS

| | | |
|---|---|---|
| 673,712 | Harper | May 7, 1901 |
| 2,822,231 | Golz et al. | Feb. 4, 1958 |
| 2,956,685 | Levi | Oct. 18, 1960 |

FOREIGN PATENTS

| | | |
|---|---|---|
| 939,721 | France | Apr. 26, 1948 |